(12) United States Patent
Rapoport

(10) Patent No.: US 9,864,034 B2
(45) Date of Patent: Jan. 9, 2018

(54) METHOD AND SYSTEM FOR A UNIVERSAL NMR/MRI CONSOLE

(71) Applicant: Aspect Imaging Ltd., Shoham (IL)

(72) Inventor: Uri Rapoport, Moshav Ben Shemen (IL)

(73) Assignee: Aspect Imaging Ltd., Shoham (IL)

( * ) Notice: Subject to any disclaimer, the term of this patent is extended or adjusted under 35 U.S.C. 154(b) by 1252 days.

(21) Appl. No.: 13/903,042

(22) Filed: May 28, 2013

(65) Prior Publication Data

US 2014/0139216 A1     May 22, 2014

Related U.S. Application Data

(60) Provisional application No. 61/728,825, filed on Nov. 21, 2012.

(51) Int. Cl.
*G01R 33/54* (2006.01)
*G01R 33/36* (2006.01)
*G01R 33/385* (2006.01)

(52) U.S. Cl.
CPC ......... *G01R 33/54* (2013.01); *G01R 33/3607* (2013.01); *G01R 33/3852* (2013.01)

(58) Field of Classification Search
CPC . G01R 33/54; G01R 33/3607; G01R 33/3852
See application file for complete search history.

(56) References Cited

U.S. PATENT DOCUMENTS

| | | | |
|---|---|---|---|
| 4,008,388 A * | 2/1977 | McLafferty | H01J 49/0036 250/281 |
| 6,081,120 A | 6/2000 | Shen | |
| 6,177,795 B1 * | 1/2001 | Zhu | G01R 33/4828 324/307 |
| 7,800,368 B2 * | 9/2010 | Vaughan | G01R 33/5612 324/318 |
| 7,999,541 B2 * | 8/2011 | Chisholm | G01N 24/087 324/300 |
| 8,319,496 B2 * | 11/2012 | Eryaman | G01R 33/285 324/309 |
| 8,471,558 B2 * | 6/2013 | Chisholm | G01N 24/087 324/300 |
| 8,807,084 B2 | 8/2014 | Rapoport et al. | |

(Continued)

FOREIGN PATENT DOCUMENTS

CN    200410099267 A    6/2005

*Primary Examiner* — Dixomara Vargas
(74) *Attorney, Agent, or Firm* — Pearl Cohen Zedek Latzer Baratz LLP

(57) ABSTRACT

A method and system are provided for providing values for control signals for a pulsed magnetic resonance spectrometer such as an NMR spectrometer or an MRI apparatus. The AC output(s) corresponding to a particular signal (e.g. a magnetization or gradient pulse or pulse sequence) originating from a source spectrometer is measured and stored by an independent control unit. The digital output of the independent control unit is then connected to the digital input of the control electronics of a target pulsed magnetic resonance spectrometer, the value of the digital output varied until the AC output(s) of the appropriate signal source of the target spectrometer matches that of the corresponding output(s) of the source spectrometer, corrected, if necessary, for differences in magnetic field strengths.

13 Claims, 3 Drawing Sheets

(56) References Cited

U.S. PATENT DOCUMENTS

| | | | |
|---|---|---|---|
| 8,851,018 B2 | 10/2014 | Rapoport et al. | |
| 8,896,310 B2 | 11/2014 | Rapoport | |
| 8,969,829 B2 * | 3/2015 | Wollenweber | G01R 33/481 250/453.11 |
| 9,100,111 B2 * | 8/2015 | Behrendt | H04L 65/4076 |
| 9,157,975 B2 * | 10/2015 | Dale | G01R 33/50 |
| 9,400,318 B2 * | 7/2016 | Fautz | G01R 33/543 |
| 2005/0043612 A1 | 2/2005 | Saint-James et al. | |
| 2011/0162652 A1 | 7/2011 | Rapoport | |
| 2011/0186049 A1 | 8/2011 | Rapoport | |
| 2011/0234347 A1 | 9/2011 | Rapoport | |
| 2011/0304333 A1 | 12/2011 | Rapoport | |
| 2012/0071745 A1 | 3/2012 | Rapoport | |
| 2012/0073511 A1 | 3/2012 | Rapoport et al. | |
| 2012/0077707 A1 | 3/2012 | Rapoport | |
| 2012/0119742 A1 | 5/2012 | Rapoport | |
| 2013/0079624 A1 | 3/2013 | Rapoport | |
| 2013/0109956 A1 | 5/2013 | Rapoport | |
| 2013/0237803 A1 | 9/2013 | Rapoport | |
| 2013/0328559 A1 | 12/2013 | Rapoport | |
| 2013/0328560 A1 | 12/2013 | Rapoport | |
| 2013/0328563 A1 | 12/2013 | Rapoport | |
| 2014/0050827 A1 | 2/2014 | Rapoport | |
| 2014/0051973 A1 | 2/2014 | Rapoport et al. | |
| 2014/0051974 A1 | 2/2014 | Rapoport et al. | |
| 2014/0051976 A1 | 2/2014 | Rapoport et al. | |
| 2014/0099010 A1 | 4/2014 | Rapoport et al. | |
| 2014/0103927 A1 | 4/2014 | Rapoport | |
| 2014/0117989 A1 | 5/2014 | Rapoport | |
| 2014/0128725 A1 | 5/2014 | Rapoport et al. | |
| 2014/0142914 A1 | 5/2014 | Rapoport | |
| 2014/0152302 A1 | 6/2014 | Rapoport et al. | |
| 2014/0152310 A1 | 6/2014 | Rapoport | |
| 2014/0158062 A1 | 6/2014 | Rapoport et al. | |
| 2014/0230850 A1 | 8/2014 | Rapoport | |
| 2014/0257081 A1 | 9/2014 | Rapoport | |
| 2014/0266203 A1 | 9/2014 | Rapoport et al. | |
| 2014/0300358 A1 | 10/2014 | Rapoport | |
| 2014/0378821 A1 | 12/2014 | Rapoport et al. | |
| 2014/0378825 A1 | 12/2014 | Rapoport et al. | |
| 2015/0059655 A1 | 3/2015 | Rapoport | |
| 2015/0065788 A1 | 3/2015 | Rapoport | |

* cited by examiner

100 – independent control unit
130 – processing unit
150 – output channels
170 – A/D converters

METHOD AND SYSTEM FOR A UNIVERSAL NMR/MRI CONSOLE

This application claims priority to U.S. Provisional Patent Application No. 61/728,825, filed Nov. 21, 2012, which is incorporated herein by reference.

FIELD OF THE INVENTION

This invention relates in general to means and methods for emulating the controller of an MRI spectrometer. It relates particularly to a method and system for monitoring the spectrometer's RF signals and reproducing those signals with a generic MRI spectrometer controller.

BACKGROUND OF THE INVENTION

NMR and MRI are among the most widely used spectroscopic techniques, finding uses in fields ranging from chemical analysis to medical imaging. One problem faced by the user of NMR/MRI systems is the incompatibility of systems produced by different manufacturers. The amount of RF power needed to effect a desired change in the magnetization of a sample inside an NMR spectrometer depends only on the magnetic field strength and the gyromagnetic ratio of the nucleus being probed. Even in the simplest case of two systems with identical magnets and systems being probed, where the RF pulses in principle should be identical, one cannot in general use a controller intended for one manufacturer's instrument with a magnet supplied by another manufacturer.

Several devices are known in the art for providing "universal" RF sources for magnetic resonance systems. Typical devices of this sort are disclosed in, for example, U.S. Pat. No. 6,081,120, U.S. Pat. Appl. Pub. No. 2005/0043612, and China Pat. Appl. No. CN200410099267. All of these devices disclose hardware to produce the RF signal that excites the change in magnetization of the sample inside the instrument's magnetic field.

None of these devices address the main reason for these incompatibilities, namely, that the digital signal sent from the console to the various signal generators (e.g. those that deliver the magnetization RF pulses, gradient field pulses, etc.) in order to produce a desired analog output to the spectrometer is not uniform across manufacturers.

Thus, a universal console for a magnetic resonance instrument that would be able to provide an input to the spectrometer electronics that yields desired analog outputs regardless of the manufacturer of the spectrometer hardware is a long-felt, but as yet unmet need.

SUMMARY OF THE INVENTION

The invention herein disclosed is designed to meet this need. It provides a method and system for measuring the values of the analog output(s) sent to the spectrometer hardware such as current, voltage, and pulse length, calculating and calibrating the console digital output(s) needed to reproduce those outputs, and storing the calibrated values for use in subsequent applications.

It is therefore an object of the present invention to disclose a method for providing values for control signals for a pulsed magnetic resonance spectrometer, wherein said method comprises: obtaining a source pulsed magnetic resonance spectrometer and associated control electronics characterized by $m_s$ input channels and $n_s$ output channels ("source spectrometer"), a target pulsed magnetic resonance spectrometer and associated control electronics characterized by $m_t$ input channels and $n_t$ output channels ("target spectrometer"), and an independent control device characterized by p input channels and q output channels capable of producing independent variable signals; connecting at least one of said p input channels of said independent control device to at least one of said $n_s$ output channels of said source spectrometer; measuring at least one value of at least one output analog signal emitted by said control electronics of said source spectrometer when said control electronics are operating according to a predetermined pulse sequence; storing said at least one value; connecting at least one of said q output channels of said independent control device to at least one corresponding input of said target spectrometer; providing at least one signal from said independent control device to said at least one input of the control electronics of said target spectrometer; bringing at least one value of at least one analog output signal emitted by said control electronics of said target spectrometer to within a predetermined tolerance of a target value; and storing at least one value of said signal output by said independent control device corresponding to the value of said signal output when said analog output signal from said target spectrometer is within said predetermined tolerance of said target value, thereby providing a value for said signal provided by said independent control device to said target spectrometer required to produce a predetermined analog output signal.

It is a further object of this invention to disclose such a method, wherein said signal output from said independent control device is a digital signal, said output of said independent control device comprises digital output means for providing output of a digital signal, and said input of said target spectrometer comprises digital input means for accepting a digital signal.

It is a further object of this invention to disclose such a method as disclosed in any of the above, wherein a single instrument acts both as said source spectrometer and as said target spectrometer.

It is a further object of this invention to disclose such a method as disclosed in any of the above, wherein said source spectrometer and said target spectrometer are different instruments.

It is a further object of this invention to disclose such a method as disclosed in any of the above, wherein said pulsed magnetic resonance spectrometers are selected from the group consisting of FT-NMR spectrometers, FT-MRI spectrometers, FT-NQR spectrometers, and FT-EPR spectrometers.

It is a further object of this invention to disclose such a method as disclosed in any of the above, wherein said at least one value of said analog output signal is selected from the group consisting of voltage, current, duration, dead time between pulses, frequency, and intensity.

It is a further object of this invention to disclose such a method as disclosed in any of the above, wherein said analog output signal is selected from the group consisting of a signal directed to a probe coil, a gradient pulse, and a timing pulse.

It is a further object of this invention to disclose such a method as disclosed in any of the above, wherein said step of bringing at least one value of at least one analog output signal emitted by said control electronics of said target spectrometer to within a predetermined tolerance of a target value comprises: sending at least one control signal of a predetermined value from said independent control device to said target spectrometer; measuring at least one analog output produced by said target spectrometer in response to said digital signal; and iteratively adjusting the value of said at least one control signal until said analog output is within a predetermined tolerance of said target value.

It is a further object of this invention to disclose such a method as disclosed in any of the above, further comprising: repeating x times (x>1) said steps following the first step of said method, each time providing a different signal from said independent control device; storing each of said values at least one signal from said independent control device obtained after said step of bringing; pairing each of said values of said signal from said independent control device with the corresponding analog output signal from said target spectrometer; calculating a correlation between a value of said analog output signal of said target pulsed spectrometer and the value of said input signal from said independent control device necessary to produce said value; and storing said correlation, thereby providing means for calculating the value of an input signal to said target pulsed magnetic resonance spectrometer necessary to produce an arbitrary output signal.

In some preferred embodiments of the invention, xy pairs of values are produced by the following method: for each value of x, said step of connecting at least one of said p input channels of said independent control device to at least of one of said $n_s$ output channels of said source spectrometer comprises connecting y input channels to y output channels, 1<y≤p; said step of connecting at least one of said q output channels of said independent control device to at least one corresponding input of said target spectrometer comprises connecting y output channels of said independent control device to y corresponding input channels of said target spectrometer; said step of storing said at least one value comprises storing y values of said output signal, one for each output channel; and said step of storing each of said values at least one signal from said independent control device comprises storing y values, one for each input channel.

It is a further object of this invention to disclose such a method as disclosed in any of the above, wherein said steps of storing are performed using digital storage means associated with said independent control device.

It is a further object of this invention to disclose such a method as disclosed in any of the above, wherein the time resolution of said independent control device is greater than that of any D/A converter in said control electronics of said source pulsed magnetic resonance spectrometer.

It is a further object of this invention to disclose such a method as disclosed in any of the above, further comprising: providing a plurality of independent measuring means to said independent control device, each of said measuring means having a time resolution faster than that of said spectrometers; measuring the value of at least one analog output of one of said spectrometers using at least two of said independent measuring means in turn; and alerting an operator if at least one result of said step of measuring differs from at least one other result of said step of measuring by more than a predetermined tolerance.

It is a further object of this invention to disclose an independent control unit for using analog output values from the control electronics of a source pulsed magnetic resonance spectrometer ("source spectrometer") to provide values for control signals for a target pulsed magnetic resonance spectrometer ("target spectrometer"), wherein said independent control unit comprises: a plurality p of input channels for accepting analog input signals from said source spectrometer; signal measuring means for measuring parameters associated with said analog input signals; a plurality q of output channels for directing control signals to said target spectrometer; signal generating means for generating q independent output signals, each of said independent signals directed toward a separate output channel; signal value storage means for storing values of said analog input signals and said output signals; comparing means for comparing a measured value of an input signal with a stored value; and calculating means for calculating a value of an output signal required to produce a predetermined output analog signal from said target spectrometer.

It is a further object of this invention to disclose such an independent control unit, wherein said signal generating means comprises digital signal generating means for generating digital signals.

It is a further object of this invention to disclose such an independent control unit as defined in any of the above, further comprising: a plurality of signal value measuring means characterized by time resolutions faster than time resolutions of said spectrometers, said signal measuring means in connection with said input channels, for measuring values of signals in said input channels; fast switching means for switching said connections between channels at a rate faster than the time resolution of a predetermined input source; and alerting means for alerting an operator if measurements made of the value of a predetermined channel by two of said signal value measuring means differ by a predetermined amount. In preferred embodiments of the invention, said signal value measuring means comprise A/D converters.

BRIEF DESCRIPTION OF THE DRAWINGS

The invention will now be described with reference to the drawings, wherein:

FIG. 1A illustrates the use of the independent control unit in the first stage of the method herein disclosed; FIG. 1B illustrates schematically the use independent control unit 100 in subsequent steps of the method herein disclosed.

DETAILED DESCRIPTION OF THE PREFERRED EMBODIMENTS

Figure 1A:
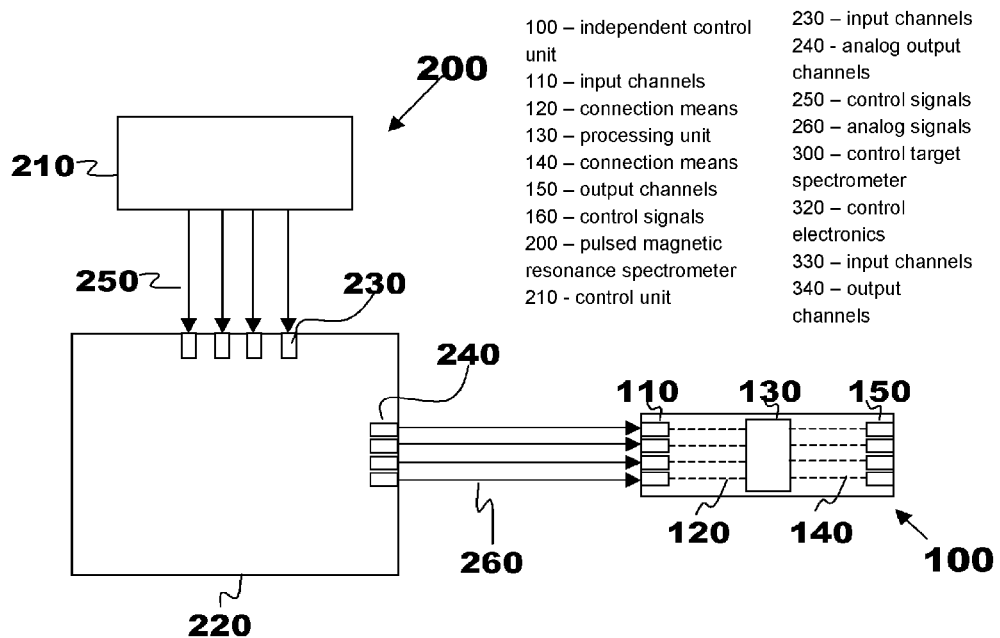
FIGS. 1A-1B present a schematic diagram illustrating the system and method disclosed herein.

In the following description, various aspects of the invention will be described. For the purposes of explanation, specific details are set forth in order to provide a thorough understanding of the invention. It will be apparent to one skilled in the art that there are other embodiments of the invention that differ in details without affecting the essential nature thereof. Therefore the invention is not limited by that which is illustrated in the figure and described in the specification, but only as indicated in the accompanying claims, with the proper scope determined only by the broadest interpretation of said claims.

The invention herein disclosed relates to methods and systems for controlling pulsed magnetic resonance systems. As used herein, the term "pulsed magnetic resonance system" refers to a system for making measurements using a spectroscopic method that relies on transitions occurring in a magnetic field and that involves providing energy to the species being probed in a pulsed (as opposed to continuous-wave) fashion. Non-limiting examples of pulsed magnetic resonance systems as the term is understood herein include systems for FT-NMR, MRI, FT-EPR, and FT-NQR.

As used herein, in reference to signal measurements, the term "value" is used to indicate the numerical quantity or quantities of a sufficient number of parameters to enable reproduction of the signal. Thus, while in some cases, a single parameter (voltage, current, time, etc.) may be sufficient to determine the "value" of the signal, in others, it might be necessary to determine the values of several parameters in order to determine the "value" of the signal. A non-limiting example of a case in which the "value" of a signal might comprise more than one number, the "value" of a vector will necessarily require determination of at least two parameters. Another non-limiting example of such a multi-parameter "value" would be a case in which figure of interest is the integrated value of a signal, the actual determination of the "value" of the signal will involve determination of at least two parameters, e.g. the intensity of the signal and its duration, since both of these quantities will be necessary to reproduce the original signal; and if the signal intensity changes during the measurement, the "value" would consist of a plurality of pairs of numbers, the intensity and the relative time at which the intensity is measured. Since methods of signal measurement and the significant parameters necessary to reproduce a given signal are well-known in the art, in order to simplify the discussion, the term "value" is used throughout in the generic sense defined in this paragraph, one of ordinary skill in the art being able to determine from context the actual number of parameters represented by a particular "value."

As used herein, with reference to signal measurement, the term "fast" refers in general to a device with a time resolution sufficiently faster than the other devices to which it is connected so that a signal originating from the other device will not have changed significantly between successive measurements of the signal.

As used herein, the term "control electronics" refers to the systems used to receive control signals (normally digital signals) from a control unit (e.g. the computer or console associated with the spectrometer) and to transform those signals into analog output (e.g. RF pulses) that is delivered to the spectrometer. Non-limiting examples of components that are included in the term include RF generators and D/A converters that convert a digital control signal into an analog signal to set the values of analog outputs passed to the spectrometer.

As used herein, the terms "connect" and "connection" can refer, depending on the context, to data connections, electrical connections, or physical connections. It will be clear to one of ordinary skill in the art in which sense the terms are meant in a given context.

Reference is now made to FIG. 1, which illustrates schematically a typical embodiment of the method and system herein disclosed. The system includes independent control unit 100, which comprises p input channels 110 which are capable of accepting analog input signals, q output channels 150 for transmitting control signals, and a processing unit 130, which is connected to the input channels via connection means 120 and to the output channels via connection means 140. In preferred embodiments, the number of input and output channels is at least equal to the number of output and input channels of the pulsed magnetic resonance spectrometers with which it is to be interfaced, as described in detail below.

In the embodiment shown, the processing unit incorporates measuring means for measuring signals received from the input channels, signal producing means for providing control signals to the output channels, and storing means for storing values of measured input parameters. Any means known in the art for measuring, storing, and producing signals can be used. In preferred embodiments of the invention, the time resolution of the measuring means and signal producing means is faster than that of the pulsed magnetic resonance spectrometers with which it is to be interfaced, as described in detail below. In more preferred embodiments, the time resolution of the processing unit is faster than 1 ms. In yet more preferred embodiments, the time resolution of the processing unit is on the order of ns. While in the embodiment shown, all of the signal processing is performed within the control unit, in other embodiments, any or all of the components may be present as separate modules or units located internally or externally to the independent control unit itself.

In preferred embodiments, the independent control unit also comprises external control and interface means (e.g. a computer interface or console) for providing a user interface and for providing a more convenient means of inputting desired commands, reading results of measurements, etc.

Reference is now made to FIG. 1A, which illustrates the use of the independent control unit in the first stage of the method herein disclosed. Independent control unit 100 is interfaced to the control electronics of a pulsed magnetic resonance spectrometer 200 (henceforth the "source spectrometer"). The source spectrometer comprises a console or other control unit 210 and the control electronics 220; the spectrometer itself is not indicated in the figure, as the method herein disclosed does not rely on connections to the spectrometer itself. The control electronics comprise inter alia a plurality $m_s$ of input channels 230 and a plurality $n_s$ of analog output channels 240. An arbitrary predetermined pulse sequence is selected, and the appropriate commands for producing the pulse sequence are entered according to the command language and interface provided by the manufacturer of the source spectrometer. The control signals 250 (in general, these will be digital signals) for commanding the control electronics are then passed to input channels 230. The control signals are then passed (in general, via a D/A converter) to the control electronics and the resulting analog signals (according to the command language and interface provided by the manufacturer of the source spectrometer) 260, which would normally be passed to the spectrometer, are transmitted from output channels 240. Non-limiting examples of typical analog output signals include RF pulses to the probe coils that provide the change in sample magnetization, gradient pulses to the gradient coils, etc.

Instead of passing the signals to the spectrometer unit, however, according to the method herein disclosed, the signals are passed to input channels 110 of independent control unit 100. The signals are then passed to the processing unit 130, where the values of the signals are measured and stored. As explained above, the exact parameters necessary to fix the value of a particular signal will depend on the particular signal, but non-limiting examples of the types of parameters measured include voltage, current, pulse duration, dead time between pulses, etc. As discussed above, in preferred embodiments of the invention, the time resolution of the components of the independent control unit will be faster than that of the corresponding components of the source spectrometer's control electronics.

In some embodiments of the invention, the processing unit may include a fast A/D converter (in preferred embodiments, with a digitization rate of at least 100 MHz), the analog signal 260 being digitized after being passed via connection means 120 to the processing unit. In some embodiments, the A/D converter may be part of the measuring means, e.g. the signal is digitized prior to its measurement as in a digital oscilloscope or similar apparatus. The measured values of the input signal are then stored.

Figure 1B:
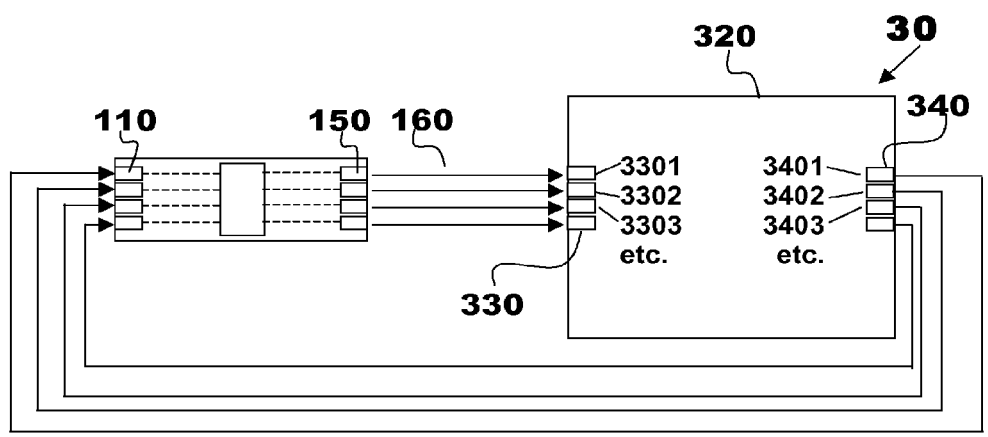

Reference is now made to FIG. 1B, which illustrates schematically the use independent control unit 100 in subsequent steps of the method herein disclosed. Output channels 150 of the independent control unit are connected to the input channels of the control electronics 320 a second pulsed magnetic resonance spectrometer 300 (henceforth the "target spectrometer"). Since the method only involves the control electronics, the control console and the spectrometer itself are not indicated in the figure.

Control unit 130 sends control signals to the output channels 150, producing output control signals 160. These control signals will in general be digital signals. In the first stage of the method herein disclosed, the initial values of these control signals can have any arbitrary value. In some embodiments of the invention, the initial values of the control signals can be set by the user via the user interface described above, or they can be estimated based on a stored table of values. The output control signals are then passed to the corresponding input channels 330 of the target spectrometer. Note that there will be a control signal corresponding to each signal that would be produced by the console of the source spectrometer. As a non-limiting example, if the digital control signal for the magnetization pulse would be transmitted from the console of the target spectrometer to a first input channel of the input channels 330 and that for a particular gradient pulse to a second input channel of the input channels 330, then the output channels of the independent control unit will be connected to the input channels 330 such that the same control signal is passed to each channel. As with the source spectrometer, control signals 160 will be passed within the control electronics of the target spectrometer to the appropriate signal generators, ultimately producing analog output signals transmitted via output channels 340.

In this stage of the method disclosed herein, rather than connecting output channels 340 to the target spectrometer itself, they are connected to the input channels 110 of the independent control unit; in each case, a particular output signal from the target spectrometer will be connected to the same input channel 110 that received the analogous signal from the source spectrometer. The output analog signals transmitted from output channels 340 of the target spectrometer are then compared to the stored values of the corresponding signals that were received from output channels 240 of the source spectrometer.

In the simplest case, in which the magnets of the source and target spectrometers have identical field strengths, in order to produce identical experimental conditions (e.g. the same change in sample magnetization, the same gradient fields, etc.), the analog signals to the spectrometer must be identical. If the analog signals produced by the control electronics of the target spectrometer in response to the digital control signals transmitted by the independent control unit are not identical to within a predetermined tolerance, then the processing unit modifies the transmitted digital control signal, measures the analog output signals from output channels 340 and compares the resulting values with the stored values of the analog signals obtained from output channels 240. These steps are then repeated iteratively until the analog output signals from received from output channels 340 are within a predetermined tolerance of the stored values of the analog signals obtained from output channels 240. Once the target values of the output signals from the target spectrometer have been obtained, the corresponding digital control signals are stored by processing unit 130. At this point, the output channels of control electronics 320 can be reconnected to the spectrometer unit of the target spectrometer and the independent control unit can then be used as a console to control target spectrometer 300.

In the more complicated case in which the magnets of the source and target spectrometers are not the same, then the analog signals will not be identical. Methods for calculating the necessary modifications of the pulses are well-known in the art, however. Thus, in preferred embodiments of the invention, control unit 130 also includes means for entering the relative magnetic field strengths of the source and target spectrometers (e.g. as a subroutine in a control program, via input from a user interface, etc.), and means for calculating the modifications necessary to a particular pulse, taking into account the known difference in magnetic field strengths. The calculating means can comprise any means known in the art, such as software for performing the calculations, a lookup table, etc.

In this fashion, a library of pulse sequences for target spectrometer 300 based on pulse sequences for source spectrometer 200 can be constructed. By using the methods This library can be constructed even if the two spectrometers are produced by different manufacturers, since the independent control unit measures the analog output of source spectrometer 200 independent of the commands sent by the source spectrometer's control console, and is used as a control console for target spectrometer 300 independent of the control software supplied by the target manufacturer's spectrometer.

Figure 2:
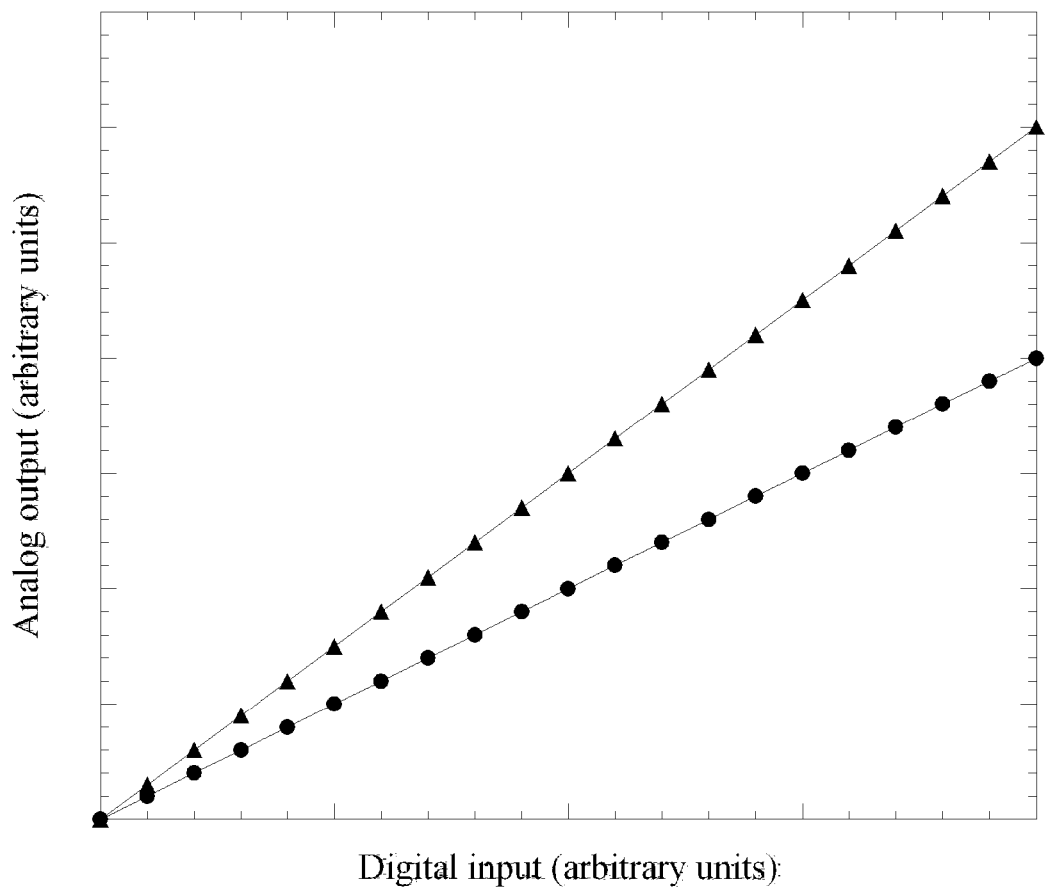
FIG. 2 presents graphically the correlations between the values of digital signals sent to the control electronics of a target spectrometer and the analog signals produced by the control electronics of the target spectrometer; and, FIGS. 3A-3B presents a schematic diagram of an embodiment of the invention disclosed herein that includes built-in monitoring of the output of the control device.

In another embodiment of the method herein disclosed, it is adapted to be able to produce any arbitrary output signal. The embodiments of method described above enable a user of target spectrometer 300 to produce a particular pulse or sequence of pulses developed for source spectrometer 200. In order to expand the method to enable production of any arbitrary output analog signal, the above method is used for a plurality of different pulses or pulse sequences (e.g. pulses of different lengths, pulses that produce different magnetization changes or gradients, etc.). For each pulse or pulse sequence, the output signal and the digital control signal needed to produce that output signal are stored. A correlation is then calculated between the digital input signal provided by processing unit 130 and the analog output signal produced by target spectrometer 300. Reference is now made to FIG. 2, which shows a typical correlation. The value of an analog output signal is plotted as a function of the digital control signal used to produce that output signal. The circles represent the values for source spectrometer 200, and are shown merely for illustration, since in general, these values will not be known to the operator. The triangles represent the values for the independent control unit, which in general will be different from those of the source spectrometer (as will those of the target spectrometer, as explained above regarding the origin of the incompatibilities between the two spectrometers). Once this correlation has been established for the independent control unit, it will be possible to produce any arbitrary output pulse merely by consulting the equation of the fit to the data for the independent control unit (the line passing through the triangles in the figure).

Figure 3A:
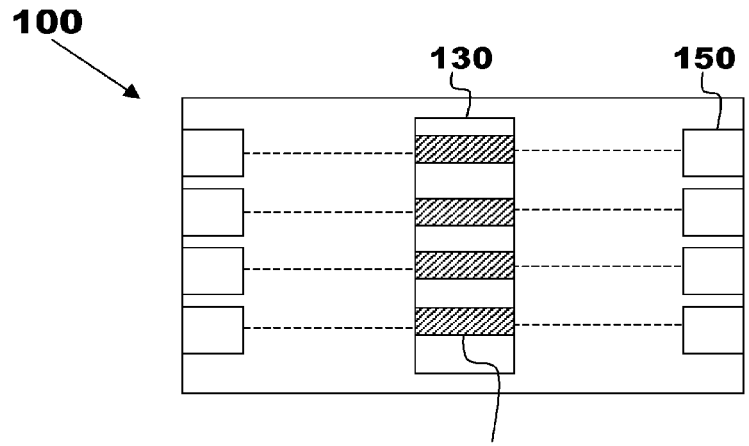
FIG. 3A illustrates a non-limiting schematic arrangement showing four measuring means.

Reference is now made to FIG. 3, which illustrates schematically an embodiment of the independent control unit that comprises redundant self-checking means to determine that the A/D converters 170 within the processing unit are working properly. In embodiments in which the independent control unit comprises these redundant self-checking means, the fast A/D converters (in alternative embodiments, any other suitably fast signal measuring means known in the art can be used) are switchably connected to the input channels. Since the fast A/D converters have a time resolution significantly faster than that of the input signal sources, the input signal will not have varied significantly between successive measurements by the different A/D converters. A non-limiting schematic arrangement showing four such measuring means is shown in FIG. 3A. Each of the signal measuring means measures (and in the case of A/D converters, digitizes) the value of the analog input to a particular input channel. In preferred embodiments, the measured values are then stored.

Figure 3B:
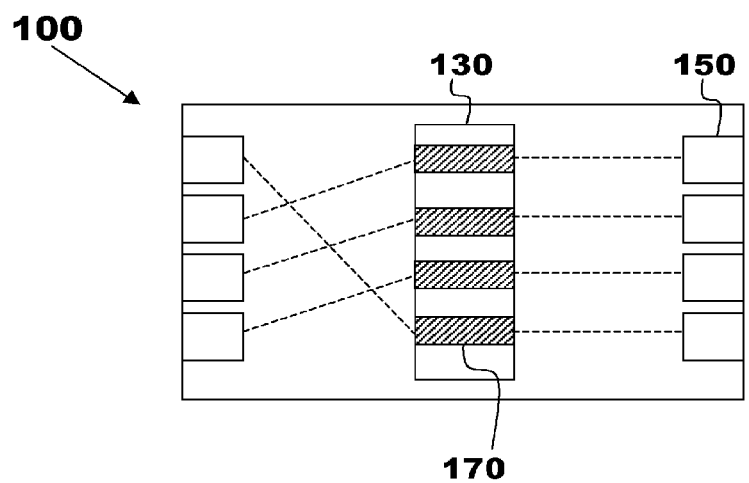
FIG. 3B illustrates the first step in a switching process.

The signal measuring means are then sequentially switched among the channels; the first step in such a switching process is shown in FIG. 3B. The switching is done more rapidly than the time resolution of the input device (e.g. the source spectrometer) so that the values of the analog signals received by the input channels will not have changed significantly between successive measurements. The step of switching the measuring means among the input channels is repeated until each of the measuring means has measured the value of the signal received by each input channel. If the value in one channel as measured by one of the measuring means (e.g. one of the onboard A/D converters) is outside of a predetermined tolerance of the values reported by the remaining measuring means, this result indicates a problem with one of the A/D converters. In the event of such a failure, the operator is alerted.

Embodiments that comprise these redundant self-checking means thus provide an additional backup for testing in real time that the independent control unit is working properly. Since the determination of the status of the independent control unit occurs during the course of a spectral measurement, the system can compensate for a glitch or temporary failure by repeating the measurement that was being made at the time of the failure. This can be especially useful in techniques such as MRI or multi-dimensional NMR spectroscopies, in which data accumulation can take minutes to days. If, for example, it is known that the failure occurred during a measurement of a particular voxel, that specific voxel can be re-examined without interrupting the measurement. This process is in contrast to other systems known in the art, in which the failure would not be known until the entire data set had been collected and the error found. It can also help to limit the number of false positives in MRI techniques in which a spurious signal arising from a measurement error due to equipment failure can be misinterpreted as a real signal.

I claim:

1. A method for providing values for control signals for a pulsed magnetic resonance spectrometer, wherein said method comprises:

obtaining a source pulsed magnetic resonance spectrometer and associated control electronics characterized by $m_s$, input channels and $n_s$ output channels of a source spectrometer, a target pulsed magnetic resonance spectrometer and associated control electronics characterized by $m_t$ input channels and $n_t$ output channels target spectrometer, and an independent control device characterized by p input channels and q output channels capable of producing independent variable signals, wherein a time resolution of said independent control device is greater than that of any D/A converter in said control electronics of said source pulsed magnetic resonance spectrometer;

connecting at least one of said p input channels of said independent control device to at least one of said $n_s$ output channels of said source spectrometer;

measuring at least one value of at least one output analog signal emitted by said control electronics of said source spectrometer when said control electronics are operating according to a predetermined pulse sequence;

storing said at least one value;

connecting at least one of said q output channels of said independent control device to at least one corresponding input of said target spectrometer;

providing at least one signal from said independent control device to said at least one input of the control electronics of said target spectrometer;

bringing at least one value of at least one analog output signal emitted by said control electronics of said target spectrometer to within a predetermined tolerance of a target value; and, storing at least one value of said signal output by said independent control device corresponding to the value of said signal output when said analog output signal from said target spectrometer is within said predetermined tolerance of said target value, thereby providing a value for said signal provided by said independent control device to said target spectrometer required to produce a predetermined analog output signal.

2. The method according to claim 1, wherein said signal output from said independent control device is a digital signal, said output of said independent control device comprises digital output means for providing output of a digital signal, and said input of said target spectrometer comprises digital input means for accepting a digital signal.

3. The method according to claim 1, wherein a single instrument acts both as said source spectrometer and as said target spectrometer.

4. The method according to claim 1, wherein said source spectrometer and said target spectrometer are different instruments.

5. The method according to claim 1, wherein said pulsed magnetic resonance spectrometers are selected from the group consisting of FT-NMR spectrometers, FT-MRI spectrometers, FT-NQR spectrometers, and FT-EPR spectrometers.

6. The method according to claim 1, wherein said at least one value of said analog output signal is selected from the group consisting of voltage, current, duration, dead time between pulses, frequency, and intensity.

7. The method according to claim 1, wherein said analog output signal is selected from the group consisting of a signal directed to a probe coil, a gradient pulse, and a timing pulse.

8. The method according to claim 1, wherein said step of bringing at least one value of at least one analog output signal emitted by said control electronics of said target spectrometer to within a predetermined tolerance of a target value comprises:

sending at least one control signal of a predetermined value from said independent control device to said target spectrometer;

measuring at least one analog output produced by said target spectrometer in response to said digital signal; and, iteratively adjusting the value of said at least one control signal until said analog output is within a predetermined tolerance of said target value.

9. The method according to claim 1, wherein said steps of storing are performed using digital storage means associated with said independent control device.

10. A method for providing values for control signals for a pulsed magnetic resonance spectrometer, wherein said method comprises:

obtaining a source pulsed magnetic resonance spectrometer and associated control electronics characterized by $m_s$ input channels and $n_s$ output channels of a source spectrometer, a target pulsed magnetic resonance spectrometer and associated control electronics characterized by $m_t$ input channels and $n_t$ output channels target spectrometer, and an independent control device characterized by p input channels and q output channels capable of producing independent variable signals;

connecting at least one of said p input channels of said independent control device to at least one of said $n_s$ output channels of said source spectrometer;

measuring at least one value of at least one output analog signal emitted by said control electronics of said source spectrometer when said control electronics are operating according to a predetermined pulse sequence;

storing said at least one value;

connecting at least one of said q output channels of said independent control device to at least one corresponding input of said target spectrometer;

providing at least one signal from said independent control device to said at least one input of the control electronics of said target spectrometer;

bringing at least one value of at least one analog output signal emitted by said control electronics of said target spectrometer to within a predetermined tolerance of a target value;

storing at least one value of said signal output by said independent control device corresponding to the value of said signal output when said analog output signal from said target spectrometer is within said predetermined tolerance of said target value, thereby providing a value for said signal provided by said independent control device to said target spectrometer required to produce a predetermined analog output signal;

providing a plurality of independent measuring means to said independent control device, each of said measuring means having a time resolution faster than that of said spectrometers;

measuring the value of at least one analog output of one of said spectrometers using at least two of said independent measuring means in turn; and alerting an operator if at least one result of said step of measuring differs from at least one other result of said step of measuring by more than a predetermined tolerance.

11. An independent control unit for using analog output values from the control electronics of a source pulsed magnetic resonance spectrometer ("source spectrometer") to provide values for control signals for a target pulsed magnetic resonance spectrometer ("target spectrometer"), wherein said independent control unit comprises:

a plurality p of input channels for accepting analog input signals from said source spectrometer;

signal measuring means for measuring parameters associated with said analog input signals;

a plurality q of output channels for directing control signals to said target spectrometer;

signal generating means for generating q independent output signals, each of said independent signals directed toward a separate output channel;

signal value storage means for storing values of said analog input signals and said output signals;

comparing means for comparing a measured value of an input signal with a stored value; and calculating means for calculating a value of an output signal required to produce a predetermined output analog signal from said target spectrometer, wherein said signal value measuring means comprise A/D converters.

12. The independent control unit according to claim 11, wherein said signal generating means comprises digital signal generating means for generating digital signals.

13. The independent control unit according to claim 11, further comprising:

a plurality of signal value measuring means characterized by time resolutions faster than time resolutions of said spectrometers, said signal measuring means in connection with said input channels, for measuring values of signals in said input channels;

fast switching means for switching said connections between channels at a rate faster than the time resolution of a predetermined input source;

storage means for storing values measured by said signal measuring means; and, alerting means for alerting an operator if measurements made of the value of a predetermined channel by two of said signal value measuring means differ by a predetermined amount.

* * * * *